(12) United States Patent
Tohyama et al.

(10) Patent No.: US 8,432,948 B2
(45) Date of Patent: Apr. 30, 2013

(54) SEMICONDUCTOR LASER DEVICE

(75) Inventors: Masaki Tohyama, Kanagawa-ken (JP); Makoto Okada, Chiba-ken (JP); Osamu Horiuchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/987,424

(22) Filed: Jan. 10, 2011

(65) Prior Publication Data
US 2011/0164643 A1 Jul. 7, 2011

Related U.S. Application Data

(63) Continuation of application No. PCT/JP2009/062451, filed on Jul. 8, 2009.

(30) Foreign Application Priority Data

Jul. 10, 2008 (JP) .................................. 2008-180655
Oct. 24, 2008 (JP) .................................. 2008-274246

(51) Int. Cl.
*H01S 5/00* (2006.01)

(52) U.S. Cl.
USPC .................................... 372/49.01; 372/43.01

(58) Field of Classification Search ............... 372/49.01, 372/43.01
See application file for complete search history.

(56) References Cited

U.S. PATENT DOCUMENTS

| | | | |
|---|---|---|---|
| 4,751,710 A | 6/1988 | Yamaguchi et al. | |
| 7,106,775 B2 * | 9/2006 | Matsuoka et al. | 372/49.01 |
| 2003/0165170 A1 * | 9/2003 | Hatakoshi et al. | 372/46 |
| 2004/0042523 A1 * | 3/2004 | Albrecht et al. | 372/70 |

FOREIGN PATENT DOCUMENTS

| | | |
|---|---|---|
| JP | 59-94892 | 5/1984 |
| JP | 64-81289 | 3/1989 |
| JP | 2003-37328 | 2/2003 |
| JP | 2003-37328 | * 7/2003 |
| JP | 2004-14820 | 1/2004 |
| JP | 2006-186228 | 7/2006 |
| JP | 2006-190797 | 7/2006 |
| JP | 2006-203162 | 8/2006 |
| JP | 2006-228826 | 8/2006 |
| JP | 2006-261222 | 9/2006 |
| JP | 2007-61806 | 3/2007 |

OTHER PUBLICATIONS

Japanese Search Report for PCT/JP2009/062451 with translation of categories.
PCT Written Opinion for PCT/JP2009/062451 (English Translation).
Notification of Examination Opinion issued on Sep. 26, 2012 in Taiwanese Patent Application No. 098123531 (with English translation ).
Notification of Reason(s) for Refusal issued Nov. 12, 2012 in Japanese Patent Application No. 2010-519800 (with English translation).
Japanese Office Action issued Feb. 19, 2013 for JP Patent Application No. 2010-519800 (with English Translation).

\* cited by examiner

*Primary Examiner* — Armando Rodriguez
(74) *Attorney, Agent, or Firm* — Oblon, Spivak, McClelland, Maier & Neustadt, L.L.P.

(57) ABSTRACT

According to one embodiment, a semiconductor laser device includes stacked layers and a light output layer. The stacked layers include an active layer. The light output layer is provided in contact with a light output end face of an optical cavity made of the stacked layers. The light output layer includes a dielectric layer having a non-amorphous film, and a conductor portion provided at least one of on a surface of the dielectric layer and inside the dielectric layer.

22 Claims, 10 Drawing Sheets

FIG. 3A
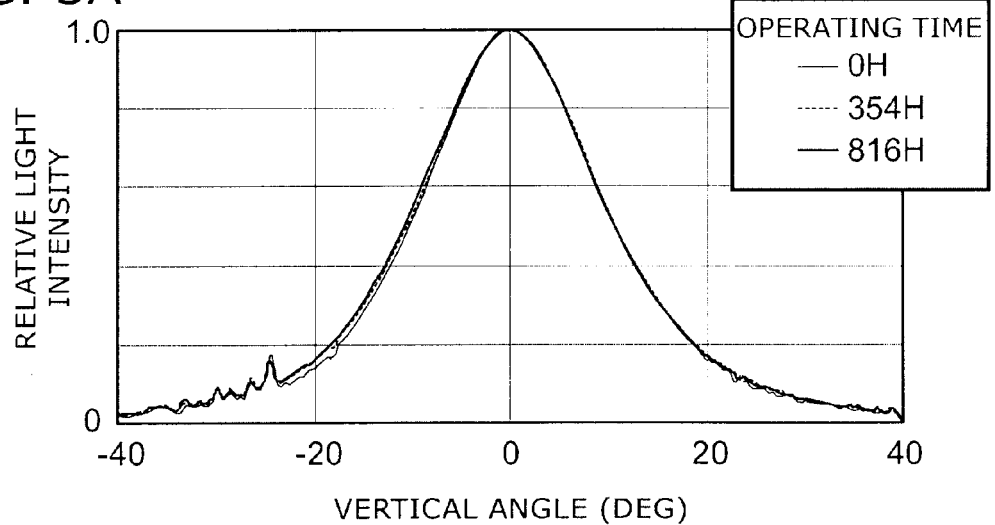
FIG. 3B
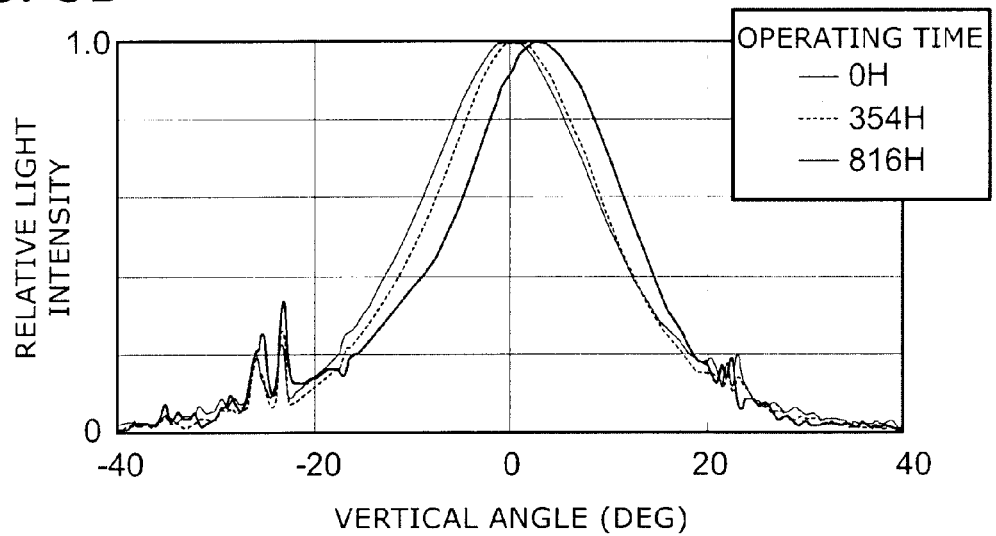
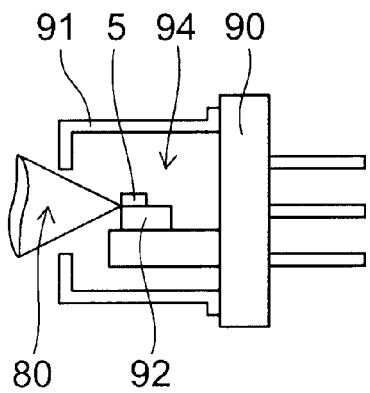
FIG. 3C
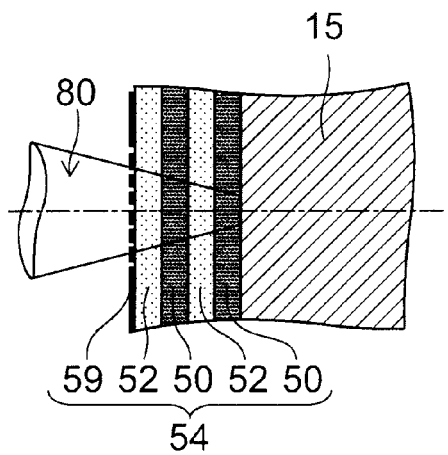
FIG. 3D

■ SiN    λ/4 FILM ( d~50nm )
▨ SiO₂   λ/4 FILM ( d~70nm )
▨ Al₂O₃  λ/2 FILM ( d~120nm )
▨ Pt

■ SiN    λ/4 FILM ( d~50nm )
▨ SiO₂   λ/4 FILM ( d~70nm )
▨ TaO₂   λ/4 FILM ( d~50nm )
▨ Pt

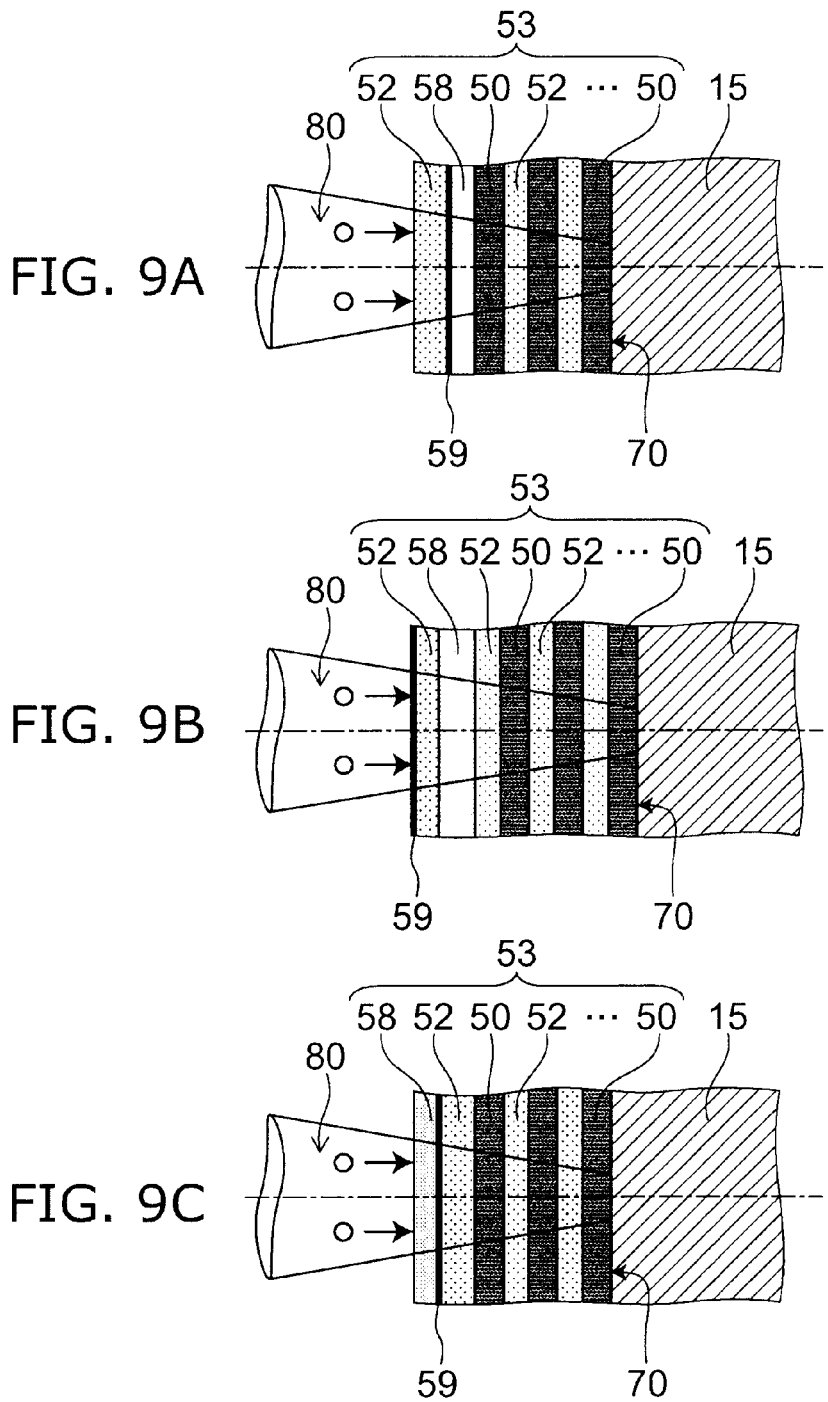

SEMICONDUCTOR LASER DEVICE

CROSS-REFERENCE TO RELATED APPLICATIONS

This is a continuation application of International Application PCT/JP2009/062451, filed on Jul. 8, 2009. This application also claims priority to Japanese Application No.2008-180655, filed on Jul. 10, 2008 and Japanese Application No.2008-274246, filed on Oct. 24, 2008. The entire contents of each are incorporated herein by reference.

FIELD

Embodiments described herein relate generally to a semiconductor laser device.

BACKGROUND

In semiconductor laser devices such as those used for DVD (Digital Versatile Disc) application, a light reflecting layer made of a dielectric layer is provided on the end face constituting the optical cavity of the laser chip. The light reflectivity of this light reflecting layer can be changed to achieve the optical power and reliability meeting the requirements of the optical disc drive.

Such a light reflecting layer can be made of a dielectric layer including a single layer film or a multilayer film. The dielectric layer can be made of such materials as $SiO_2$, $Si_xN_y$, $Al_2O_3$, AlN, $TiO_2$, and $ZrO_2$.

When laser light is emitted to the outside through such a dielectric layer, its surface tends to accumulate charges due to dielectric polarization because the laser light has high energy. Furthermore, the package member constituting the semiconductor laser device, the mounting material of the chip, the sealing gas, and the ambient atmosphere often include Si organic compounds and hydrocarbon compounds. In the case where the emission wavelength of laser light is as short as 500 nm or less, the light beam has high energy, and hence easily decomposes the volatile gas generated from Si organic compounds and hydrocarbon compounds. For instance, Si organic compounds such as siloxanes, which are polymers with (Si—O—Si) bonds, and silanols including (—Si—OH) bonds, are easily decomposed by light beams having an emission wavelength of 500 nm or less used for the next generation DVD application. The decomposed atoms such as Si and O, and their reaction products are likely to be adsorbed by the charge on the surface of the light output layer, and to form a deposit made of e.g. $SiO_x$. Such a deposit varies the far field pattern (FFP) of the laser beam, which is important for optical disc application. Furthermore, the decrease of optical power and the variation of driving current occur, and degrade the reliability.

Thus, in a semiconductor laser module for the next generation DVD application, it is necessary to remove the contaminant source attached to the package components as much as possible, and to provide hermetic sealing to prevent the intrusion of external contaminants. This inevitably complicates the module assembly process.

BRIEF DESCRIPTION OF THE DRAWINGS

FIGS. 3A to 3D illustrate FFP for the operation in an open atmosphere;

FIGS. 9A to 9C are schematic sectional views showing an eighth embodiment; and

DETAILED DESCRIPTION

In general, according to one embodiment, a semiconductor laser device includes stacked layers and a light output layer. The stacked layers include an active layer. The light output layer is provided in contact with a light output end face of an optical cavity made of the stacked layers. The light output layer includes a dielectric layer having a non-amorphous film, and a conductor portion provided at least one of on a surface of the dielectric layer and inside the dielectric layer.

Embodiments of the invention will now be described with reference to the drawings.

Figure 1A:
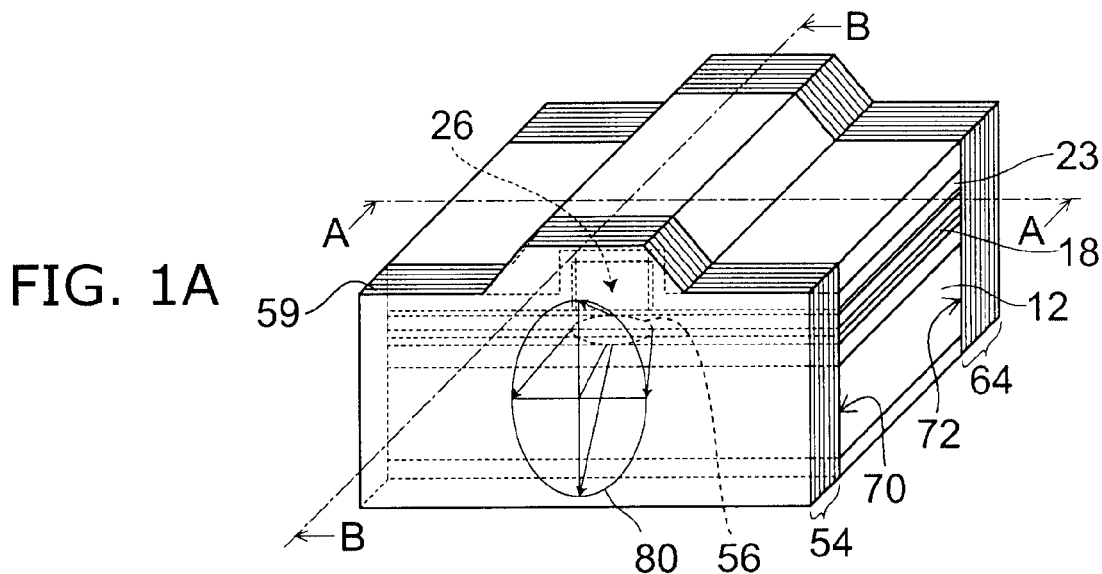
FIGS. 1A to 1C show a semiconductor laser device according to a first embodiment.
Figure 1B:
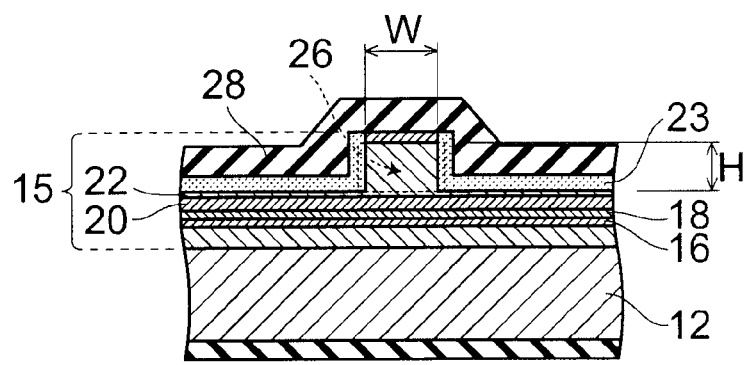
Figure 1C:
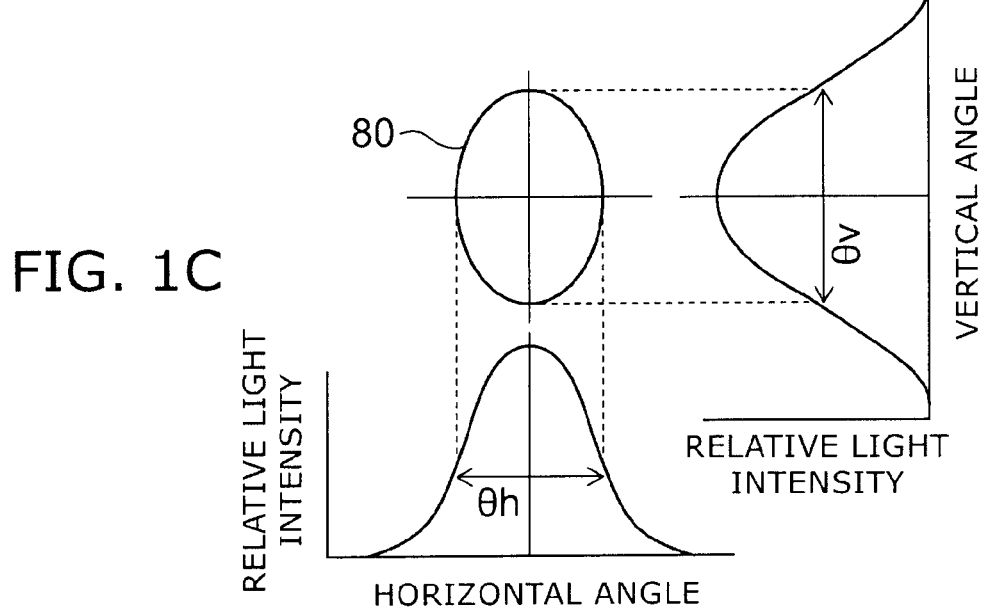

FIGS. 1A to 1C show a semiconductor laser device according to a first embodiment of the invention. More specifically, FIG. 1A is a schematic perspective view, FIG. 1B is a schematic sectional view taken along line A-A, and FIG. 1C illustrates a far field pattern.

The chip has a structure in which nitride stacked layers 15 including an optical guide layer 16, an active layer 18, an optical guide layer 20, and a cladding layer 22 is formed on an n-type GaN substrate 12. The portion to the middle of the cladding layer 22 is shaped into a striped ridge to form a waveguide 26 for light. An insulating film 23 made of e.g. oxide is formed so as to cover the surface except the top of the waveguide 26. This structure is referred to as the real refractive index type. Furthermore, chip cleavage is performed in a plane perpendicular to the extending direction of the stripe to form an optical cavity having mirror-like end faces. Of the end faces of the optical cavity, one constitutes a light output end face 70, and the other constitutes a light reflecting end face 72.

A light output layer 54 is formed on the light output end face 70. A light reflecting layer 64 is formed on the light reflecting end face 72. Emission light from the active layer 18 passes through the light output layer 54, and is emitted as a light beam 80 from a light output region 56 to the outside.

FIG. 1C illustrates the far field pattern (FFP) of the light beam 80. The light beam 80 diverges vertically and horizontally from the light output end face 70 and travels while keeping an elliptical cross section. The emission angle at which the light intensity is 50% of its maximum is denoted by θv (degrees) in the direction vertical to the active layer 18 and θh (degrees) in the horizontal direction. For optical disc application, it is preferable that the cross section of the light beam 80 be as close to a perfect circle as possible. However, different optical confinement between the vertical and horizontal directions as shown in FIG. 1B often results in an elliptical cross-sectional shape with θv larger than θh.

Figure 2A:
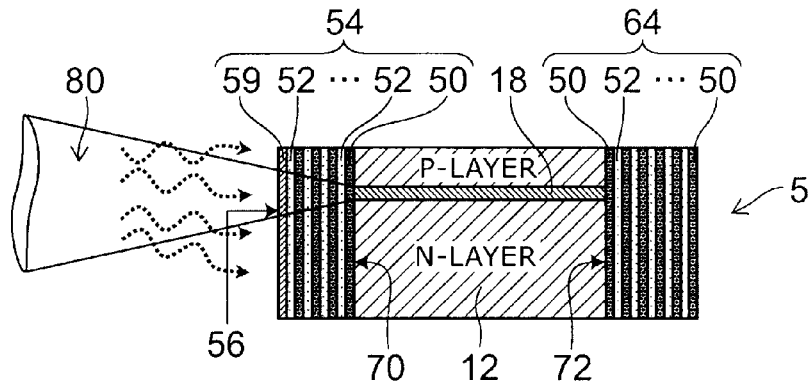
FIGS. 2A to 2D are schematic views illustrating the chip cross-section.
Figure 2B:
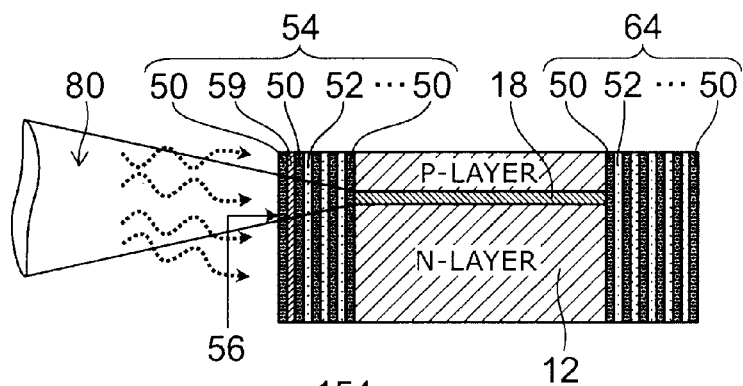
Figure 2C:
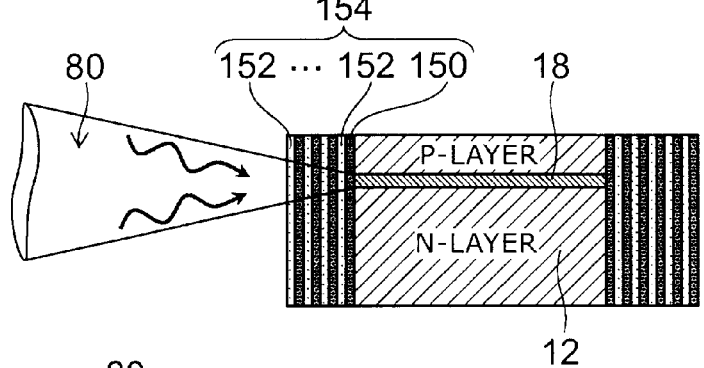
Figure 2D:
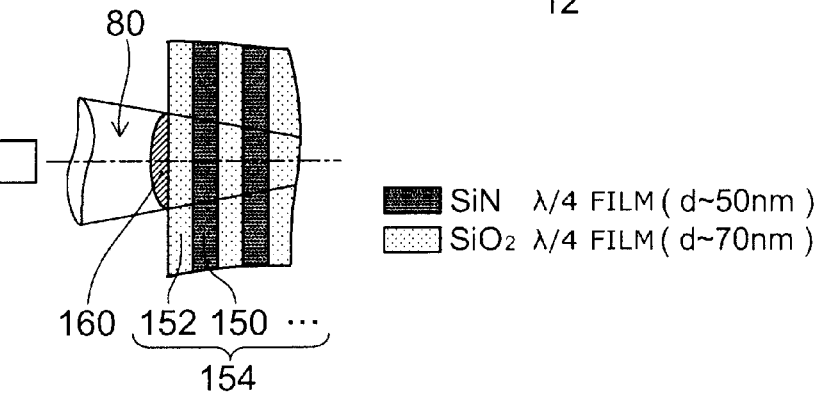

FIGS. 2A to 2D are schematic views illustrating the chip of the semiconductor laser device. More specifically, FIG. 2A shows a cross section taken along line B-B of FIG. 1A. FIG. 2B shows a variation of the light output layer. FIG. 2C shows a cross section of a comparative example. FIG. 2D is a partial schematic sectional view of the neighborhood of the light output region of the light beam in the comparative example.

FIG. 2A shows a chip 5 constituting this embodiment. In the chip 5, a light output layer 54 is formed on the light output end face 70. The light output layer 54 includes a dielectric layer 53 and a conductor portion 59. In the dielectric layer 53, for instance, from the stacked layers 15 (refractive index: 2.5-2.7) side, four layers of an SiN film (refractive index: generally 2.1) 50 of a quarter wavelength (thickness: generally 50 nm) and four layers of an $SiO_2$ film (refractive index: generally 1.5) 52 of a quarter wavelength (thickness: generally 70 nm) are alternately laminated. The conductor portion 59 is provided on the $SiO_2$ film 52 at the surface. Here, the SiN film 50 may include an $Si_3N_4$ film.

The SiN film 50 having a thermal expansion coefficient of generally $3.2 \times 10^{-6}/°$ C. is brought into contact with the light output end face 70 having a thermal expansion coefficient of generally $3.17 \times 10^{-6}/°$ C. This can reduce the stress in thermal expansion and thermal contraction, and facilitates improving the adhesiveness. Furthermore, the SiN film 50 and the light output end face 70 both include N. Hence, at the interface therebetween, dangling bonds are reduced, and the density of nonradiative recombination centers can be reduced. This facilitates suppressing the decrease of the COD (catastrophic optical damage) occurrence level.

On the light reflecting end face 72 on a side opposite to the light output end face 70, a light reflecting layer 64 is provided. For instance, the light reflecting layer 64 is made of a dielectric layer in which six layers of the SiN film 50 of a quarter wavelength and five layers of the $SiO_2$ film 52 of a quarter wavelength are alternately stacked. The reflectivity of the light output layer 54 is set to generally 45%, and the reflectivity of the light reflecting layer 64 is set to generally 90%.

In this embodiment, the thickness of the SiN film 50 and the $SiO_2$ film 52 is set to a quarter of the corresponding in-medium wavelength. However, the configuration of the reflecting layer is not limited thereto. It is also possible to use a Bragg reflector in which the total thickness of a pair of the SiN film 50 and the $SiO_2$ film 52 is set to a half wavelength. Alternatively, without limiting the thickness of each film thereto, the dielectric layer 53 may be configured so as to have a desired reflectivity as a whole.

The material of the conductor portion 59 can be a metal such as Au, Al, W, Fe, Mo, Pt, and Pd. The thickness thereof is set to e.g. 1-20 nm. Then, the conductivity can be maintained without causing any substantial absorption of the light beam 80.

In the comparative example of FIG. 2C, the light beam 80 is emitted from the light output layer 154 consisting only of a dielectric layer. In this case, the light output layer 154 transmitting the light beam 80 causes dielectric polarization. This makes its surface prone to accumulate charges in the neighborhood of the light output region. Hence, if Si organic compounds or hydrocarbon compounds are present around the semiconductor laser chip, decomposed atoms such as Si and O, and their reaction products are likely to be adsorbed by the charge on the surface of the light output layer 154, and to form a deposit 160 made of e.g. $SiO_x$ as shown in FIG. 2D.

In contrast, this embodiment includes a conductor portion 59 made of Au. Hence, the charge can be diffused throughout the surface of the conductor portion 59, which is sufficiently larger in area than the light output region 56. Atoms such as Si and O, and their reaction products are adsorbed extensively on the surface of the conductor portion 59 as indicated by dotted lines in FIG. 2A. This can suppress concentrated formation of deposits in the neighborhood of the light output region.

The chip having the structure of FIG. 2A with the conductor portion 59 made of Au was operated under constant power output condition in an open atmosphere at a case temperature (Tc) of 75° C. and an optical power (Po) of 20 mW. Then, there was no change in FFP such as axial displacement. Furthermore, there was no variation in the operating current. Moreover, by SEM (scanning electron microscopy), no deposit was observed in the neighborhood of the light output region 56 on the surface of the light output layer 54.

On the other hand, in the chip of the comparative example of FIG. 2C, the surface of the dielectric layer is not overcoated with a conductor portion, and the chip includes a light output layer 154 with the $SiO_2$ film 152 exposed. The chip was operated under the same condition in an open atmosphere. Then, axial displacement of FFP occurred. The reflectivity changed over time, and caused fluctuation in the operating current. Furthermore, according to SEM observation of the neighborhood of the light output region after the operation, a deposit 160 as shown in FIG. 2D was locally produced. This deposit 160 was analyzed by field emission Auger electron spectroscopy. Then, components such as Si and O were detected. Thus, it turned out that amorphous $SiO_x$ was one of the components. With the enlargement of such a deposit 160, the decrease of optical power of the light beam and the change of FFP become more conspicuous, and the light beam fails to meet the requirements of the optical disc drive.

In contrast, this embodiment can suppress deposition of reaction products of Si and O in the neighborhood of the light output region 56. FFP is stable even in long-term operation. The decrease of optical power and the variation of operating current are suppressed. Thus, this embodiment provides a semiconductor laser device with improved reliability.

The deposit 160 may occur also from carbon resulting from the decomposition of hydrocarbon compounds. However, the conductor portion 59 of this embodiment facilitates suppressing such deposits.

FIG. 2B shows a variation of the light output layer 54 of the first embodiment. As long as the conductor portion 59 is not in direct contact with the stacked layers 15, the conductor portion 59 may be provided in the middle of the dielectric layer 53, for instance. In FIG. 2B, a thin Al film is provided between the SiN films 50. In the case of a metal prone to oxidation such as Al, its oxidation in an open atmosphere can be suppressed by providing an SiN film 50 or $SiO_2$ film 52 on the surface.

Even if the conductor portion 59 is provided inside the light output layer 54, the surface potential of the light output layer 54 can be made uniform, and an effect similar to that of the embodiment of FIG. 2A can be achieved.

The second embodiment is a semiconductor laser device in which the conductor portion 59 is made of a metal having catalytic action. The metal having catalytic action can be e.g. Pt, Pd, Rh, and Ir.

FIGS. 3A to 3D illustrate FFP for the operation in an open atmosphere. More specifically, FIG. 3A shows FFP in the second embodiment. FIG. 3B shows FFP in a comparative example. FIG. 3C is a schematic sectional view of an open-to-atmosphere package. FIG. 3D is a partial schematic sectional view of the neighborhood of the light output region. Here, in both cases, the operating condition was Tc=75° C. and Po=20 mW (constant power).

As shown in FIG. 3C, in the package, a submount 92 made of an insulating material such as AlN is bonded onto a stem 90 made of an iron-based or copper-based material. The stacked layers 15 side of the chip 5 is bonded onto the submount 92. For operation in an open atmosphere, no glass is bonded to the cap 91, and no hermetic sealing is provided. The light beam 80 is emitted in the direction shown in FIG. 3D.

In the comparative example shown in FIG. 3B, after 816 hours, the FFP peak exhibited an axial displacement of approximately 4 degrees. That is, because the semiconductor laser device is not vertically symmetric in shape, the deposit 160 tends to have an asymmetric shape and causes axial displacement in the vertical direction. Furthermore, generation of the deposit 160 such as $SiO_x$ varies the reflectivity of the light output layer 54, and is likely to vary the optical power and operating current.

In contrast, this embodiment has a structure similar to that of FIG. 2A except that the conductor portion 59 is made of Pt. In this embodiment, as shown in FIG. 3A, after 816 hours, little axial displacement occurs in FFP, and little variation occurs in the optical power and operating current. In the case of using an open-to-atmosphere package, a gas including Si organic compounds emitted from adhesives used for component packaging may intrude into the package from outside.

However, decomposed Si and O, and their reaction products are adsorbed on the surface of Pt. Further growth or deposition of the reaction products can be suppressed by the catalytic action of Pt, such as decomposition of the reaction products. Thus, in a severe operating environment such as an open atmosphere, the conductor portion 59 having catalytic action can further enhance the effect of suppressing deposits and further improve the reliability.

In this case, Pt acts as a heterogeneous catalyst to adsorb, decompose, and remove contaminants such as Si organic compounds. The thickness of Pt can be set to e.g. 1-20 nm. As shown in FIG. 3D, instead of being a continuous film, the conductor portion 59 made of Pt can include a particulate portion. Even in this case, its catalytic action can be maintained.

The semiconductor laser device of this embodiment enables stable and long-term operation without hermetic sealing. This embodiment can reduce the number of package components and simplify the packaging process. Hence, this embodiment achieves high productivity, and consequently facilitates cost reduction.

Figure 4:
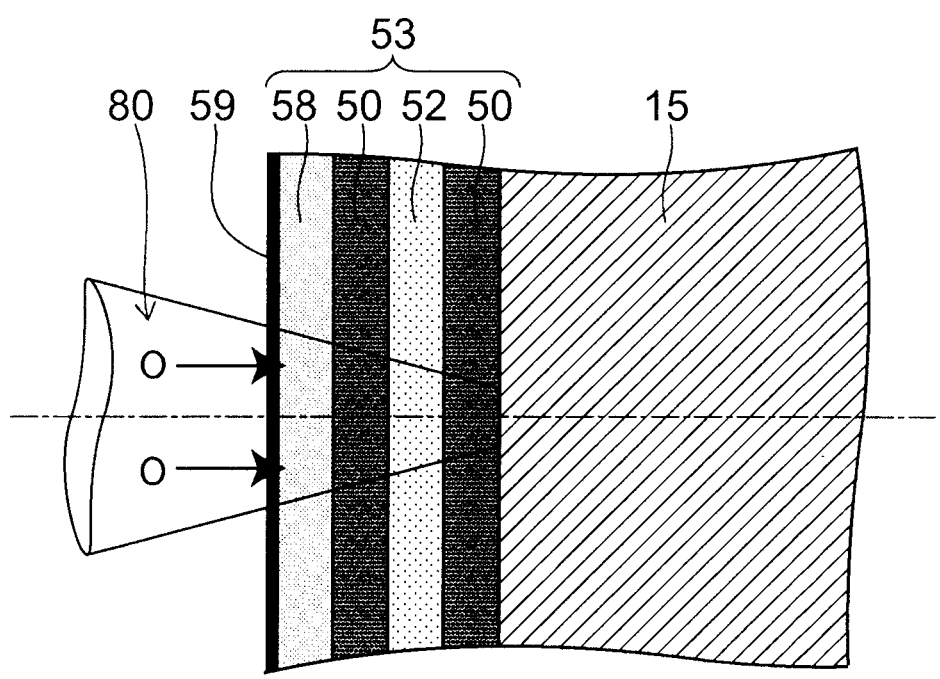
FIG. 4 is a schematic sectional view illustrating a third embodiment.

FIG. 4 is a schematic sectional view illustrating a third embodiment.

In this embodiment, at least one of the dielectric layers 53 constituting the light output layer 54 is a non-amorphous film 58. In this figure, the surface side of the dielectric layer 53 adjacent to the conductor portion 59 is a non-amorphous film 58. The material of the non-amorphous film 58 can be oxides, nitrides, and oxynitrides such as $SiO_2$, SiN, $Al_2O_3$, AlN, $TiO_2$ (having photocatalytic action), $TaO_2$, $ZrO_2$, and TiN.

Among them, for instance, $SiO_2$, SiN, and $Al_2O_3$ can be at least partly crystallized or polycrystallized by laser irradiation. This facilitates suppressing penetration of O. In this specification, the "non-amorphous film" includes also a film including a crystallized region or a polycrystallized region in at least a portion of the film, with the remaining portion being an amorphous region.

If the dielectric layer 53 is an amorphous film, oxygen (O) can penetrate therethrough. Even if a thin conductor layer exists, O can penetrate through a pinhole. The penetrated O can react with Si constituting e.g. the SiN film to form $SiO_x$. This may vary the reflectivity of the light output layer 54. In this embodiment, it is easy to suppress intrusion of O into the dielectric layer 53 to stably keep the composition of the dielectric layer 53. Intrusion of O can be suppressed more effectively by providing a non-amorphous film 58 outside the dielectric film, which is prone to composition change caused by O. That is, as shown in this figure, it is preferable that the non-amorphous film 58 be provided adjacent to Pt. This further reduces the reflectivity variation of the light output layer 54, and reduces the variation of optical power and operating current. Thus, this embodiment provides a semiconductor laser device capable of improving the long-term reliability.

In the third embodiment, a non-amorphous film 58 is provided to suppress intrusion of O into the dielectric layer. However, even if O intrudes into the dielectric layer, the change of the optical characteristics of the dielectric layer can be suppressed if O is stopped in the oxide film so as not to reach the nitride film.

Figure 5A:
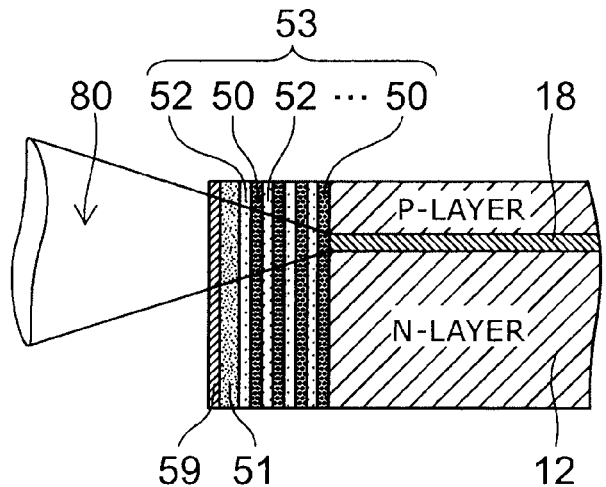
FIGS. 5A and 5B are schematic sectional views showing a fourth embodiment.
Figure 5B:
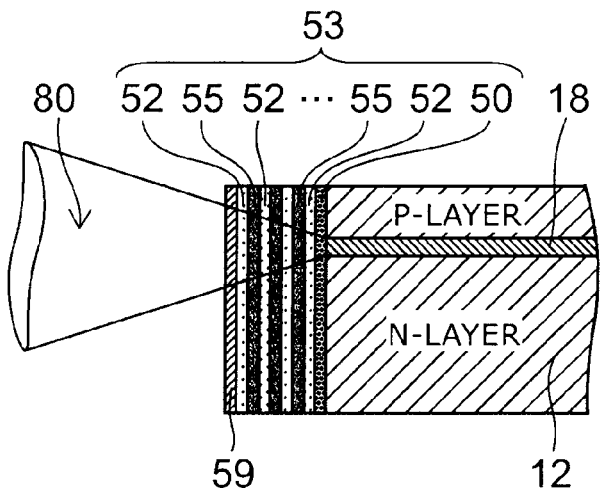

FIGS. 5A and 5B are schematic sectional views showing a fourth embodiment. More specifically, FIG. 5A shows the case where the surface of the dielectric layer is an $Al_2O_3$ film. FIG. 5B shows the case where the dielectric layer includes a $TaO_2$ film.

In FIG. 5A, an $Al_2O_3$ film 51 is provided on the laminated layers of SiN films 50 and $SiO_2$ films 52. The thickness of the $Al_2O_3$ film 51 corresponds to generally a half wavelength (120 nm). Hence, even if the $Al_2O_3$ film 51 is provided, the reflectivity of the light output layer 54 remains unchanged at approximately 45%. On the other hand, by providing the $Al_2O_3$ film 51, the distance from the conductor portion 59 made of e.g. Pt to the SiN film 50 is easily set to 190 nm or more. Consequently, even in the case of intrusion of O, the time to reach the SiN film 50 can be prolonged. The optical characteristics such as refractive index do not change as long as the intruding O does not reach the SiN film 50. Hence, there is no change in the reflectivity of the light output layer 54 and the shape of the light beam 80 emitted through the light output layer 54.

In FIG. 5B, the SiN film 50 is adjacent to the stacked layers 15. The conductor portion 59 side is provided with a structure in which an $SiO_2$ film 52 and a $TaO_2$ film 55 are stacked, each having a thickness of generally a quarter wavelength. By the stacking of the $SiO_2$ film 52 having a low refractive index (generally 1.5) and the $TaO_2$ film 55 having a high refractive index (generally 2.2), the light output layer 54 has a reflectivity of approximately 50%. The total thickness of the stacked $SiO_2$ film 52 and $TaO_2$ film 55 is approximately 400 nm, and can be made sufficiently thicker than in FIG. 4, for instance. Even in the case of intrusion of O from the topmost surface, the amount of O reaching the SiN film 50 can be suppressed. Furthermore, even if O is mixed into the $SiO_2$ film 52 and the $TaO_2$ film 55, the optical characteristics such as refractive index do not change. Hence, there is no change in the reflectivity of the light output layer 54 and the shape of the light beam 80 emitted through the light output layer 54.

In FIG. 5B, the laminated structure of the $SiO_2$ film 52 and the $TaO_2$ film 55 is described. Besides, a laminated structure of an $SiO_2$ film and a $ZrO_2$ film can also be used. That is, it is possible to use a laminated structure in which two or more oxide layers are stacked.

The film adjacent to Pt may be either a low refractive index film or a high refractive index film as long as the film thickness is adjusted to obtain a desired reflectivity. In FIG. 5B, the film adjacent to Pt is the $SiO_2$ film 52. However, for instance, a $TaO_2$ film of a half wavelength may be further provided on the $SiO_2$ film 52 before Pt is provided thereon. In this case, a $TaO_2$ film can be used as the film adjacent to Pt without changing the reflectivity of the light output layer 54. Simultaneously, the total thickness of the $SiO_2$ film and the $TaO_2$ film can be set to e.g. approximately 500 nm or more.

As described above, the fourth embodiment allows various film configurations. The film configuration can be adjusted so as to obtain a desired reflectivity while ensuring a sufficient oxide film thickness enough to prevent intrusion of O. For instance, all the films may be made of oxide films.

Figure 6A:
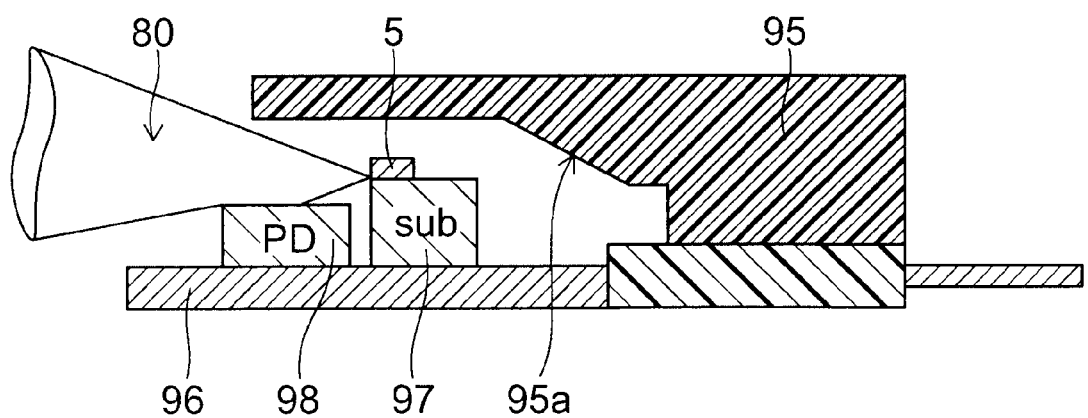
FIGS. 6A and 6B are schematic views showing a fifth embodiment.
Figure 6B:
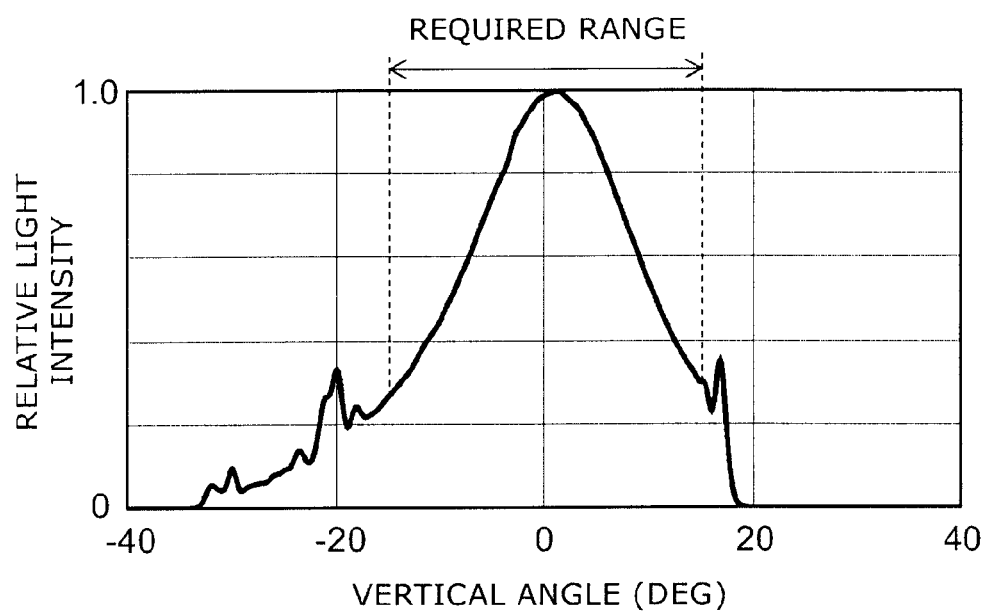

FIGS. 6A and 6B show a fifth embodiment. More specifically, FIG. 6A is a schematic sectional view, and FIG. 6B is a graph showing its FFP.

The semiconductor laser device of this embodiment is based on a lead frame type package (open package) with a chip 5 mounted in an open atmosphere. A monitoring photodiode (photodetecting element) 98 and a submount 97 are mounted on a lead 96. The chip 5 is mounted on the submount 97.

Typically, the monitoring photodiode is provided on the light reflecting layer 64 side. If the emission wavelength is shorter than 500 nm, the light emitted through the light reflecting layer 64 alters and discolors the inner surface 95a of the cap 95 made of resin. Thus, its reflectivity changes, and the intensity of light incident on the monitoring photodiode varies. This may make it difficult to accurately monitor the light intensity of the light beam 80 from the light output layer 54.

In contrast, in this embodiment, the monitoring photodiode 98 is provided on the light output layer 54 side of the chip 5. As in the FFP shown in FIG. 6B, the tail portion of the light beam 80 having a vertical angle of generally 15 degrees or more can be incident on the photodiode 98. On the other hand, the optical pickup device uses the light beam 80 in the range of the vertical angle smaller than 15 degree. Hence, there is no problem in practical use. Thus, the intensity of the light beam 80 can be accurately monitored.

The frame type package is based on a multiple patterning lead frame. Hence, the processes of chip mounting, wire bonding, and resin molding can be performed in a short time. Such a packaging process has higher productivity than the packaging process for the CAN type package. Furthermore, in this embodiment, the light output layer 54 includes a conductor portion 59, and deposits can be suppressed. Hence, this embodiment can achieve higher productivity than in the case of using a hermetic sealing package.

Furthermore, the frame type semiconductor laser device facilitates downsizing and attachment to a packaging substrate. This enables an optical disc drive with small size and high productivity.

Figure 7A:
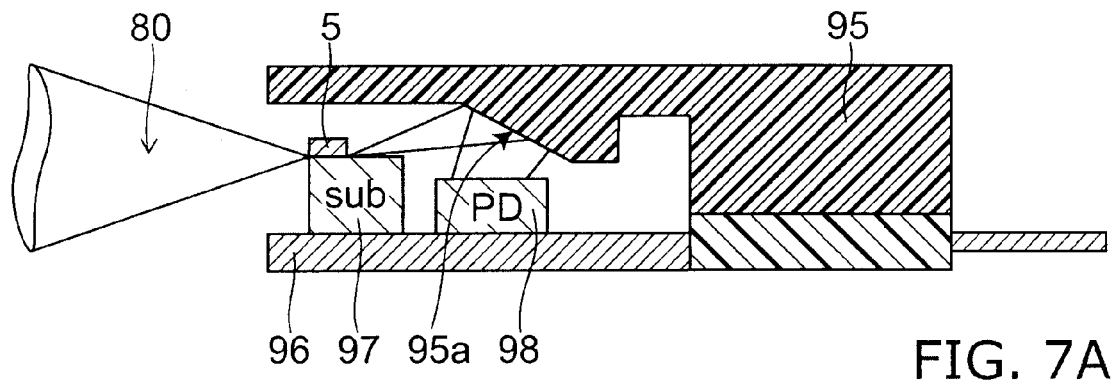
FIGS. 7A to 7D are schematic views showing a sixth embodiment.
Figure 7B:
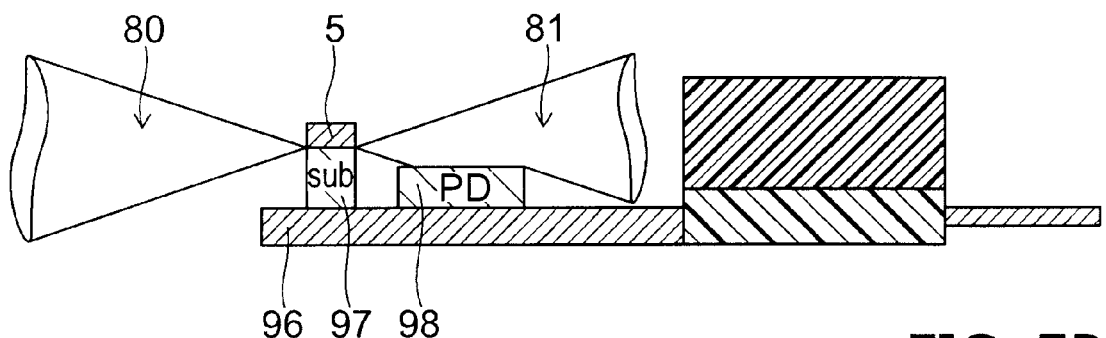
Figure 7C:
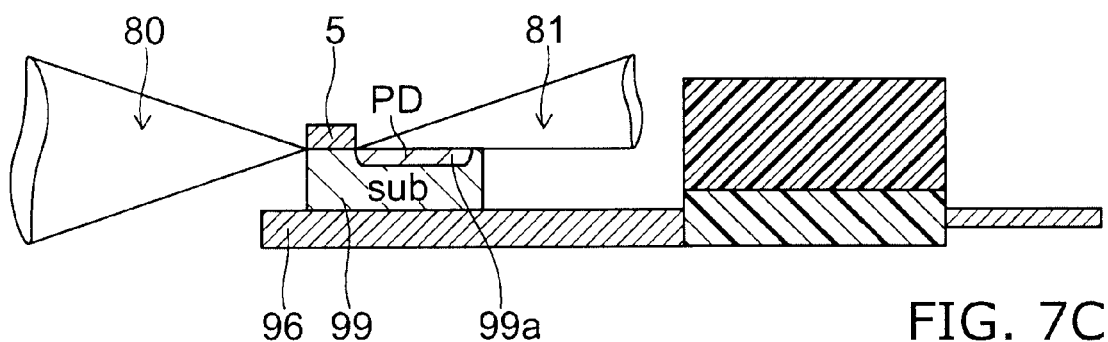
Figure 7D:
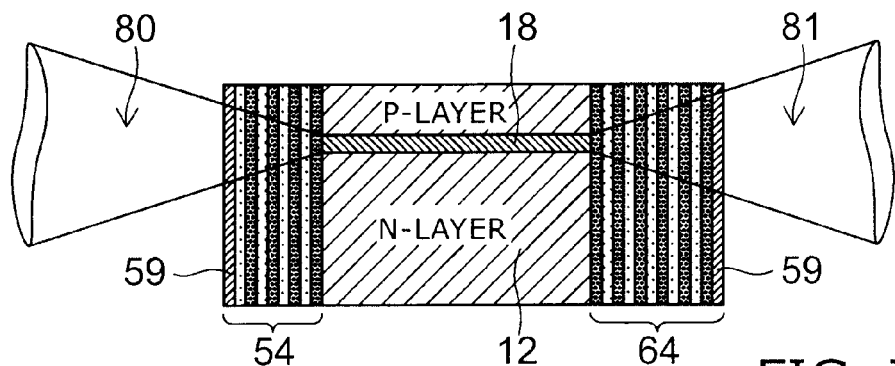

FIGS. 7A to 7D are schematic views showing a sixth embodiment. More specifically, FIG. 7A is a sectional view, FIG. 7B shows a first variation, FIG. 7C shows a second variation, and FIG. 7D is a sectional view of the chip.

In FIG. 7A, the light beam 81 emitted from the light reflecting layer 64 of the chip can be received by a monitoring photodiode 98. The light beam 81 may be reflected at the inner surface 95a of the cap 95 and incident on the photodiode 98. In this case, alteration and discoloration of the resin can be suppressed by keeping the light intensity of the light beam 81 at a low level or by providing a reflective film on the inner surface 95a. Here, the light reflecting layer 64 includes a reflection-side dielectric layer 64 provided in contact with the light reflecting end face 72, and a reflection-side conductor portion 59 provided at least one of on the surface of and inside the dielectric layer 64.

In the first variation shown in FIG. 7B, the light beam 81 emitted backward through the light reflecting layer 64 can be directly received by the photodiode 98. Hence, no alteration or discoloration occurs at the inner surface of the cap made of e.g. resin. Furthermore, the cap can be omitted. And in the second variation shown in FIG. 7C, a photodiode 99a may be integrated into a silicon submount 99. This can reduce the number of components.

Figure 8A:
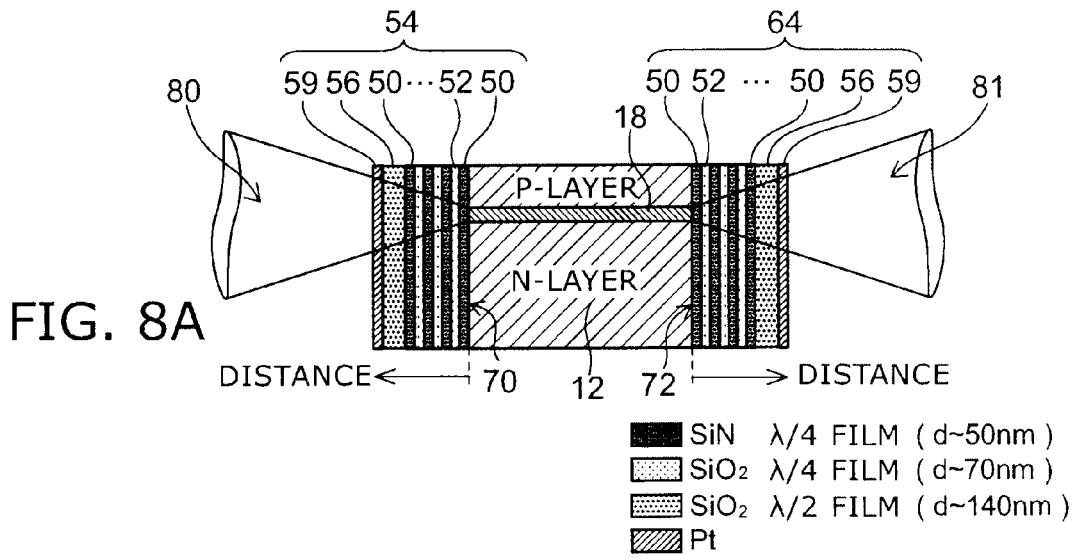
FIGS. 8A to 8C illustrate a semiconductor laser device according to a seventh embodiment.
Figure 8B:
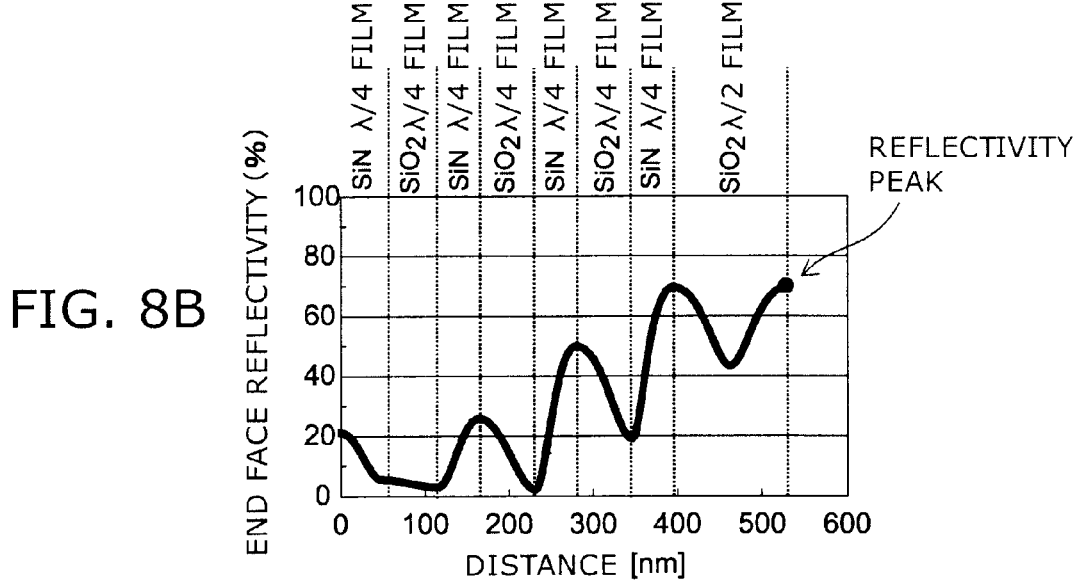
Figure 8C:
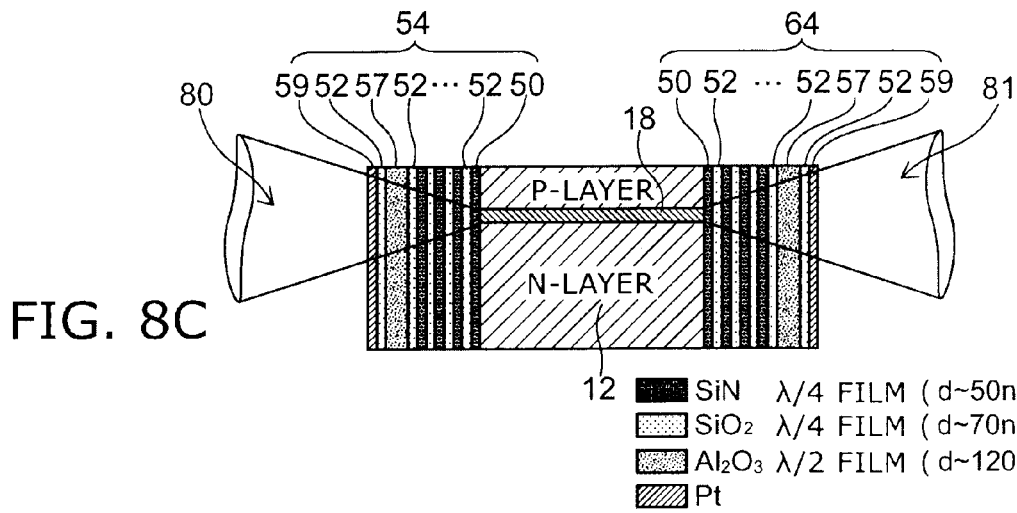

FIGS. 8A to 8C illustrate a seventh embodiment. More specifically, FIG. 8A is a schematic sectional view of a semiconductor laser chip, FIG. 8B is a graph showing its end face reflectivity, and FIG. 8C is a schematic sectional view of the chip of a variation.

In the structure of FIG. 8A, the light output layer 54 and the light reflecting layer 64 are stacked generally symmetrically along the direction of the light beam. That is, the reflectivity of the light output layer 54 and the reflectivity of the light reflecting layer 64 are generally equal. Hence, the light beam 80 emitted forward and the light beam 81 emitted backward are generally equal in optical power. Thus, the light beam can be emitted backward more intensely than in the first to sixth embodiment.

In this embodiment, for instance, the light output layer 54 and the light reflecting layer 64 are each made of a dielectric layer in which SiN films 50 of a quarter wavelength (generally 50 nm) and $SiO_2$ films 52 of a quarter wavelength (generally 70 nm) are alternately stacked. However, unlike the first embodiment, the most superficial $SiO_2$ film 56 exclusively has a thickness of a half wavelength (generally 140 nm). Furthermore, on the outside thereof, a conductor portion 59 made of Pt is provided.

FIG. 8B shows the dependence of the end face reflectivity (%) on distance (nm). The distance (nm) indicated on the horizontal axis represents the distance from the light output end face 70 or the light reflecting end face 72 to the outside. With the increase of the laminated layers, the reflectivity periodically increases and decreases. Here, by setting the thickness of the most superficial $SiO_2$ film 56 to generally a half wavelength, the reflectivity can be set to its peak. Consequently, in this embodiment, the reflectivity of both the light output layer 54 and the light reflecting layer 64 can be made as high as generally 70%, for instance.

The lasing threshold current of the laser chip can be reduced by increasing the product of the (front) reflectivity of the light output end face 70 and the (rear) reflectivity of the light reflecting end face 72. In this embodiment, while maintaining a kink level at a desired optical power or more, both the front reflectivity and the rear reflectivity can be set to a high level. Hence, the lasing threshold current can be further reduced, and the long-term reliability is easily improved.

Typically, the photodiode 98 is made of Si. However, in the wavelength band of 500 nm or less used for the next generation DVD application, the Si photodiode has low light receiving sensitivity and may fail to produce a sufficient monitoring current. Furthermore, for instance, the reflectivity of the light output layer 54 is set to generally 45%, and the reflectivity of the light reflecting layer 64 is set to generally 90%. Thus, the ratio of the optical power of the light beam 80 emitted forward to that of the light beam 81 emitted backward is often set to generally 8 to 1.

In contrast, in the seventh embodiment, the light beam 80 emitted forward and the light beam 81 emitted backward are made generally equal in optical power. This facilitates further reducing the variation of the monitoring current and makes it possible to provide a semiconductor laser device for DVD application with higher reliability. Here, the thickness of each dielectric film constituting the light output layer 54 and the light reflecting layer 64 is not limited to those in FIGS. 8A and 8B. That is, while maintaining the kink level at the desired optical power or more, the thickness may be set so as to increase the product of the reflectivity of the light output end face 70 and the reflectivity of the light reflecting end face 72. Alternatively, within the range of ensuring the desired reliability, the thickness may be set so as to decrease the product of the reflectivity of the light output end face 70 and the reflectivity of the light reflecting end face 72.

In the variation shown in FIG. 8C, SiN films 50 of a quarter wavelength (generally 50 nm) and $SiO_2$ films 52 of a quarter wavelength (generally 70 nm) are alternately laminated. Then, an $Al_2O_3$ film 57 of a half wavelength (generally 120 nm) and an additional $SiO_2$ film 52 of a quarter wavelength are laminated. Also in this variation, the reflectivity is set to its peak. The reflectivity of both the light output layer 54 and the light reflecting layer 64 is generally 70%. In this variation, the $SiO_2$ film 52 superior in adhesiveness to the conductor portion 59 is provided on the topmost surface side of the dielectric layer. Simultaneously, the $Al_2O_3$ film 57 capable of more effectively suppressing intrusion of O is provided between the $SiO_2$ films 52. Consequently, intrusion of O from the topmost surface can be suppressed. Simultaneously, even in the case of intrusion of O, the time to reach the SiN film 50 can be prolonged. Thus, the change of the optical characteristics of the dielectric layer can be further suppressed.

In the structure described in this variation, the dielectric layer adjacent to the conductor portion 59 is an $SiO_2$ film, and the dielectric layer capable of more effectively suppressing intrusion of O is an $Al_2O_3$ film. However, other various combinations of dielectric layers can be used. Furthermore, the thickness of each stacked film does not need to be limited to a quarter wavelength and a half wavelength. The thickness can be appropriately adjusted so as to obtain a desired reflectivity.

In the first to seventh embodiment, a non-amorphous film 58 can also be provided as shown in FIG. 4. Furthermore, the position of the non-amorphous film 58 is not limited to that in FIG. 4.

FIGS. 9A to 9C are schematic sectional views showing other examples regarding the position of the non-amorphous film 58. In FIG. 9A, the conductor portion 59 is provided not on the surface of the light output layer 54, but inside the light output layer 54. As shown in this figure, the non-amorphous film 58 may be provided adjacent to the conductor portion 59 and between the conductor portion 59 and the SiN film 50 nearest to the surface side of the light output layer 54. This non-amorphous film 58 is provided outside the dielectric film such as the SiN film 50, which is prone to composition change caused by O. Hence, intrusion of O to the inside is suppressed, and the reflectivity variation can be reduced. Here, a "nitrogen-containing film" is prone to composition change by intrusion of O. This invention is also applicable to the case where a nitride film of e.g. AlN and an oxynitride film represented by e.g. SiON and AlON are used instead of the SiN film 50.

In FIG. 9B, the $SiO_2$ film 52 is provided between the non-amorphous film 58 and the conductor portion 59. In this manner, the conductor portion 59 and the non-amorphous film 58 may be spaced from each other. That is, because the non-amorphous film 58 is provided outside the dielectric film such as the SiN film 50, which is prone to composition change caused by O, intrusion of O to the inside is suppressed, and the reflectivity variation can be reduced.

Furthermore, as shown in FIG. 9C, also in the case where the non-amorphous film 58 is located outside the conductor portion 59, intrusion of O into the dielectric layer 54 can be suppressed.

The non-amorphous film 58 shown in FIGS. 9A to 9C is applicable to the first and second embodiments shown in FIGS. 1A to 1C, the fourth embodiment shown in FIGS. 5A and 5B, the fifth embodiment shown in FIGS. 6A and 6B, the sixth embodiment shown in FIGS. 7A to 7D, and the seventh embodiment shown in FIGS. 8A to 8C. That is, migration of O to the SiN film is suppressed by providing the non-amorphous film 58 on the topmost surface of the light output layer 54, or between the topmost surface and the SiN film. In other words, the non-amorphous film 58 functions as an oxygen blocking layer and can reduce the reflectivity variation of the light output layer 54.

Figure 10A:
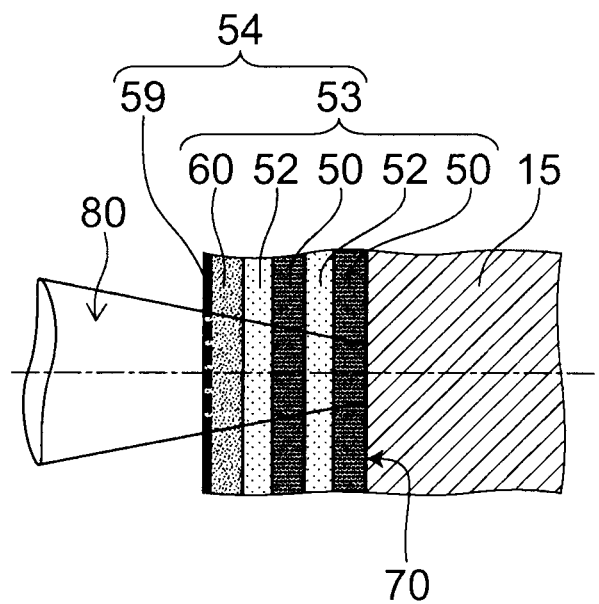
FIGS. 10A and 10B are schematic sectional views showing a ninth embodiment.
Figure 10B:
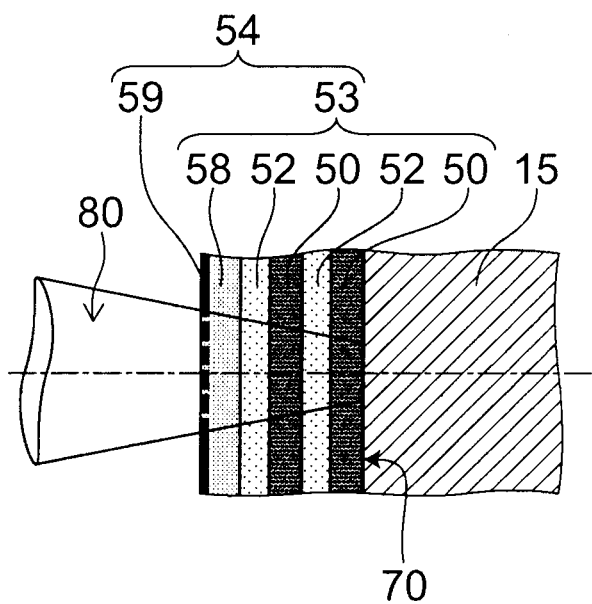

FIGS. 10A and 10B are schematic sectional views of a semiconductor laser device according to a ninth embodiment.

Here, the conductor portion 59 has catalytic action like Pt. In this case, even if Si, O, CO, and organic matter decomposed by the light beam 80, and their reaction products are adsorbed on Pt having high adsorbability, they are removed by the strong oxidizing action of Pt, and the deposition thereof is suppressed. However, even on a catalytic film of a metal like Pt, after the lapse of a longer period of time, organic matter, Si, and reaction products are gradually accumulated, and the surface of the catalytic film is extensively covered therewith. This decreases the oxidizing power of Pt. This state is referred to as "deactivation" of the catalyst.

In FIG. 10A, a titanium oxide ($TiO_2$) film 60 is provided between the conductor portion 59 and the $SiO_2$ film 52. That is, the $TiO_2$ film 60 constitutes the surface of the dielectric layer 53 on a side opposite to a side in contact with the light output end face 70. The $TiO_2$ film 60 absorbs light having energy equal to or larger than the band gap and generates an electron-hole pair. Thus, active oxygen is emitted, and deposits made of organic matter and reaction products can be decomposed and removed. In this embodiment, a conductor portion 59 made of e.g. Pt is provided on the $TiO_2$ film 60 so as to expose part of the $TiO_2$ film 60. The $TiO_2$ film 60 irradiated with the light beam 80 acts as a photocatalyst. Here, such a photocatalyst can also be based on titanates such as $SrTiO_3$, or a ZnO (zinc oxide) film.

By irradiating the conductor portion 59 with the light beam 80, the conductor portion 59 can be turned into fine particles as shown in FIG. 3D. Thus, in the region around the conductor portion 59 dispersed as fine particles, the $TiO_2$ film 60 is exposed, and a cross-sectional structure as shown in FIG. 10A can be realized. Alternatively, fine openings can be formed in the conductor portion 59 by a patterning process, for instance. Active oxygen generated from the exposed portion of the $TiO_2$ film 60 by irradiation with the light beam 80 accelerates oxidation reaction in the neighborhood of the adjacent conductor portion 59. Thus, deposits on the surface of the conductor portion 59 are decomposed and removed.

Thus, deactivation of the metal catalyst such as Pt is suppressed, and its strong catalytic action can be maintained for a long time. If the region of the conductor portion 59 turned into fine particles is made discontinuous, the surface charge may fail to sufficiently diffuse on the surface of the conductor portion 59. However, deposition of organic matter and reaction products can be suppressed by photocatalytic action of the $TiO_2$ film 60. Hence, generation of deposits is suppressed by the catalyst made of a metal such as Pt having high oxidizing power and the photocatalyst made of titanium oxide exhibiting oxidizing power by light irradiation. Thus, this embodiment provides a semiconductor laser device with improved reliability.

Here, the oxide film such as the $SiO_2$ film 52 adjacent to the $TiO_2$ film 60 can be made of a non-amorphous film. Then, intrusion of O can be suppressed, and the reflectivity variation of the dielectric layer 53 can be reduced.

In FIG. 10B, a non-amorphous film 58 made of $TiO_2$ is provided adjacent to the particulate conductor portion 59. The non-amorphous film 58 made of $TiO_2$ can act as a photocatalytic film. Then, with a simpler structure, migration of O to the SiN film 50 is suppressed while suppressing deposition of reaction products onto the conductor portion 59 by photocatalytic action. Thus, the reflectivity variation of the dielectric layer 53 can be further reduced.

This invention is not limited to a nitride semiconductor laser device capable of emitting light in the wavelength range of 500 nm or less. For instance, the semiconductor laser device may be a semiconductor laser device made of InAlGaP-based materials capable of emitting light in the red wavelength range, a semiconductor laser device made of AlGaAs-based materials capable of emitting light in the red to infrared wavelength range, and a semiconductor laser device made of InP-based materials capable of emitting light in the wavelength range of 1.3-1.6 µm.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A semiconductor laser device comprising:
    stacked layers including an active layer operable to emit a light beam; and
    a light output layer provided in contact with a light output end face of an optical cavity made of the stacked layers, the light output layer including a dielectric layer having a non-amorphous film and a nitrogen-containing film, and a conductor portion provided at least one of on a surface of the dielectric layer and inside the dielectric layer, a thickness of the conductor portion being not less than 1 nm and not more than 20 nm,
    the non-amorphous films being provided on a surface of the light output layer, or between the surface of the light output layer and the nitrogen-containing film, and
    the light beam being emitted through the conductor portion.

2. The device according to claim 1, wherein a surface of the dielectric layer in contact with the light output end face is made of the nitrogen-containing film.

3. A semiconductor laser device comprising:
    stacked layers including an active layer operable to emit a light beam; and
    a light output layer provided in contact with a light output end face of an optical cavity made of the stacked layers, the light output layer including a dielectric layer having a non-amorphous film, and a conductor portion provided at least one of on a surface of the dielectric layer and inside the dielectric layer, a thickness of the conductor portion being not less than 1 nm and not more than 20 nm,
    the dielectric layer being provided between the conductor portion and the light output end face and including at least an oxide film, and
    the light beam being emitted through the conductor portion.

4. The device according to claim 3, wherein the oxide film includes at least two oxide layers having different refractive indices laminated in the oxide film.

5. The device according to claim 1, wherein the conductor portion has catalytic action.

6. The device according to claim 5, wherein the conductor portion includes at least one of Pt, Pd, Rh, and Ir.

7. The device according to claim 1, wherein
    the conductor portion includes a region dispersed as fine particles, and
    the light beam is emitted through the dispersed region.

8. A semiconductor laser device comprising:
    stacked layers including an active layer operable to emit a light beam; and
    a light output layer provided in contact with a light output end face of an optical cavity made of the stacked layers, the light output layer including a dielectric layer having a photocatalytic film provided on a side opposite to the light output end face and a conductor portion provided on the photocatalytic film so as to expose a part of the photocatalytic film, a thickness of the conductor portion being not less than 1 nm and not more than 20 nm,
    the light beam being emitted through the conductor portion.

9. The device according to claim 8, wherein the dielectric layer further includes an oxide film.

10. The device according to claim 8, wherein the dielectric layer further includes a nitrogen-containing film.

11. The device according to claim 10, wherein a surface of the dielectric layer in contact with the light output end face is made of the nitrogen-containing film.

12. The device according to claim 8, wherein the photocatalytic film is a non-amorphous film.

13. The device according to claim 10, wherein the dielectric layer includes a non-amorphous film provided on a surface of the light output layer, or between the surface of the light output layer and the nitrogen-containing film.

14. The device according to claim 8, wherein the conductor portion has catalytic action.

15. The device according to claim 14, wherein
    the conductor portion includes a region dispersed as fine particles, and
    the light beam is emitted through the dispersed region.

16. The device according to claim 8, wherein the photocatalytic film includes at least one of titanium oxide, titanate, and zinc oxide.

17. The device according to claim 1, further comprising:
    a photodetecting element being able to receive a part of a light beam emitted through a light reflecting layer provided on a light reflecting end face opposed to the light output end face,
    the light reflecting layer including a reflection-side dielectric layer provided in contact with the light reflecting end face, and a reflection-side conductor portion provided at least one of on a surface of the reflection-side dielectric layer and inside the reflection-side dielectric layer.

18. The device according to claim 1, further comprising:
    a photodetecting element,
    the photodetecting element being able to receive a part of a light beam emitted from the active layer through the light output layer.

19. The device according to claim 3, wherein the conductor portion has catalytic action.

20. The device according to claim 3, wherein
    the conductor portion includes a region dispersed as fine particles, and
    a light beam is emitted from the dispersed region.

21. The device according to claim 3, further comprising:
    a photodetecting element being able to receive a part of a light beam emitted through a light reflecting layer provided on a light reflecting end face opposed to the light output end face,
    the light reflecting layer including a reflection-side dielectric layer provided in contact with the light reflecting end face, and a reflection-side conductor portion provided at least one of on a surface of the reflection-side dielectric layer and inside the reflection-side dielectric layer.

22. The device according to claim 3, further comprising:
a photodetecting element,
the photodetecting element being able to receive a part of a light beam emitted from the active layer through the light output layer.

\* \* \* \* \*